(12) United States Patent
Reverdy et al.

(10) Patent No.: US 9,019,031 B2
(45) Date of Patent: Apr. 28, 2015

(54) METHOD FOR THE PHASE MODULATION OF A CARRIER SIGNAL TRANSMITTED FROM A TRANSMITTER TO A CONTACTLESS TRANSPONDER, AND DEVICE FOR IMPLEMENTING SAME

(75) Inventors: Jacques Reverdy, Crolles (FR); Elisabeth Crochon, Poisat (FR); Francois Dehmas, Vif (FR); Florian Pebay-Peyroula, Saint Nizier du Moucherot (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 106 days.

(21) Appl. No.: 13/806,912

(22) PCT Filed: Jun. 24, 2011

(86) PCT No.: PCT/EP2011/060659
§ 371 (c)(1),
(2), (4) Date: Mar. 8, 2013

(87) PCT Pub. No.: WO2011/161257
PCT Pub. Date: Dec. 29, 2011

(65) Prior Publication Data
US 2013/0154756 A1 Jun. 20, 2013

(30) Foreign Application Priority Data

Jun. 25, 2010 (FR) ...................................... 10 55100

(51) Int. Cl.
*H03C 3/02* (2006.01)
*H04L 27/20* (2006.01)

(52) U.S. Cl.
CPC .............. *H03C 3/02* (2013.01); *H04L 27/2014* (2013.01)

(58) Field of Classification Search
USPC ........................................................ 332/144
See application file for complete search history.

(56) References Cited

U.S. PATENT DOCUMENTS

2003/0045970 A1  3/2003  Maryanka

FOREIGN PATENT DOCUMENTS

FR  2917557  12/2008
WO  97/41671  11/1997

*Primary Examiner* — Joseph Chang
(74) *Attorney, Agent, or Firm* — Occhiuti & Rohlicek LLP

(57) ABSTRACT

A method for phase modulation of a carrier signal from a transmitter to a contactless transponder in which data is coded as consecutive symbols, each corresponding to a predefined number of carrier cycles, and in which a symbol time is at least two cycles of the carrier signal includes, at the transmitter, spreading a phase jump of a symbol in relation to a preceding symbol over a first part of the symbol time. The establishment of the phase jump is completed in the first part of the symbol time. The periods of the cycles are constant during a second part of the symbol time.

22 Claims, 4 Drawing Sheets

METHOD FOR THE PHASE MODULATION OF A CARRIER SIGNAL TRANSMITTED FROM A TRANSMITTER TO A CONTACTLESS TRANSPONDER, AND DEVICE FOR IMPLEMENTING SAME

CROSS REFERENCE TO RELATED APPLICATION

This application is the national phase under 35 USC 371 of international application no. PCT/EP2011/060659, filed Jun. 24, 2011, which claims the benefit of the priority date of French application no. 1055100, filed Jun. 25, 2010. The contents of the aforementioned applications are incorporated herein in their entirety.

FIELD OF DISCLOSURE

The present invention relates generally to the technique of phase modulation of a carrier signal in the context of data interchanges between a reader or fixed base station and a contactless transponder (card, tag) placed in the electromagnetic field emitted by the reader.

More specifically, the invention relates to a method for the phase modulation of a carrier signal from a transmitter to a contactless transponder and a device for implementing the method.

BACKGROUND

The electronic radio frequency identification (RFID) systems are finding increasingly widespread applications.

In practice, these systems are already today widely used to identify, locate or track objects, animals or people (access cards; toll; electronic passport etc.).

It generally concerns a reader and a transponder incorporated, for example, in a support such as a tag or a card. In the present invention, reference is equally made to the remotely powered transponders, that is to say transponders that do not have their own energy source to transmit data, and transponders that have their own energy source, but which, should the latter fail or for certain applications, can operate, for example, in degraded mode, as a remotely powered transponder.

The reader, considered as a base station, generates a carrier wave (short range alternating magnetic field) which serves to power the contactless cards in proximity to the antenna of the reader. This is referred to as remote power feed. Furthermore, this carrier wave supplies a clock to the card for the operation of its various blocks. Finally, it serves as a support for the reader—card and card—reader communications.

In the exchange of information between the base station and the transponder, a distinction is drawn between the pathway from the reader to the card (the base station has a transmitter function) and the pathway from the card to the reader (the base station has a receiver function).

This exchange is subject to the constraints/provisions set out, for example, in the ISO14443 Standard which defines, among other things, the type of modulation and of coding as well as the bit rate of the transactions between a reader and a contactless card. This bit rate is currently between 106 and 848 kb/s.

Proposals are currently being formulated to extend this bit rate beyond the Mb/s.

To be accepted, these extensions have to be as compatible as possible with the current standard. In practice, the manufacturers want a minimum of modifications to the base of readers already installed.

Another constraint relates to the magnetic field emissions which have to comply with the European recommendations ERC-70-03 and/or ETS 300-330.

STATE OF THE ART

The contactless transponders that satisfy the ISO 14443 Standard very often have remote power feed, that is to say they draw their energy from the magnetic field generated by the reader. It will be recalled that this mode of operation is not mandatory but the ISO 14443 transmitter (reader) has to provide a field level of between 1.5 and 7.5 A/m to be able to provide the remote power feed for the cards.

This field serves as a communication channel: it is the support for transferring information between the reader and the card (this direction is called the go pathway), and between the card and the reader (return pathway).

The magnetic field is generally created by an RF current, at 13.56 MHz, circulating in an antenna made up of one or more loops. This antenna may be modeled electrically in the form of a resonant circuit of R, L, C type characterized by a center frequency $f_c$, a quality coefficient Q and having a limited bandwidth BP.

$$f_c=1/(2\pi\sqrt{LC}), Q=(L2\pi f_c)/R \text{ and } BP=f_c/Q$$

To optimize the use of the power supplied by the reader, it is desirable to reduce the losses in the antenna by minimizing the resistance R. In this case, while the quality coefficient Q is indeed high, it does have the effect of then restricting the bandwidth of the channel.

For the current bit rates of the ISO 14443 Standard, this is not a problem.

However, if the aim is to increase the transmission bit rates, the bandwidth of the channel has to be widened and therefore the quality coefficient of the transmitting antenna has to be reduced, which reduces the power supply from the transponder.

At very high bit rates, the choice of the transmission channel bandwidth therefore results from a trade-off between remote power feed and transmission bit rate.

A first solution for increasing the bit rates could consist in reducing the duration of a bit by keeping the types of modulation and of coding currently described in the ISO 14443 Standard, which is reproduced in the table below:

| Bit rate | Bit duration | $BP_{min}$ | $Q_{max}$ |
|---|---|---|---|
| 106 kb/s | 9.43 µs | 212 kHz | 64 |
| 848 kb/s | 1.18 µs | 1.7 MHz | 8 |
| 1.7 Mb/s | 590 ns | 3.4 MHz | 4 |
| 6.78 Mb/s | 147 ns | 13.56 MHz | 1 |

It can be seen that the quality coefficient rapidly becomes too low to be able to consider a remote power feed that is compatible with the power available on the current readers.

To increase the binary bit rate without excessively increasing the bandwidth, the concept of multi-level modulation has been introduced. Each level corresponds to a symbol.

In this approach, a symbol can code a number of bits and the binary bit rate is then linked to the number of bits per symbol and to the duration of the symbol. It is the latter which defines the bandwidth necessary to the signal and it does not vary according to the number of levels.

Binary bit rate=$\log_2$(number of symbols)/symbol duration.

For example, if there are 4 states and therefore 4 symbols, it is possible to code 2 bits per symbol of 8*Tc, the bit rate will then be 3.4 Mb/s, assuming a carrier at 13.56 MHz.

Another problem linked to the contactless cards is the operating distance which is generally between 0 and 5 cm, which implies a variation of the coupling coefficient k between the antennas, accompanied by a variation of the channel bandwidth.

Consequently there is a very wide amplitude dynamic range of the field which singularly complicates the amplitude demodulation on the contactless card side and, a fortiori, the multi-level amplitude demodulation to be able to code a number of bits per symbol which would be the most logical line of continuity with the ISO14443 Standard.

This is why it is envisaged to orient the modulation of the magnetic field of the base station toward a phase jump modulation (or PSK, standing for phase shift keying) using different phase states of the carrier.

This proposed modulation still presents a few drawbacks:

In practice, the phase modulation indirectly induces spurious amplitude modulations at the change of symbols linked to the channel bandwidth. These amplitude modulations can degrade the discrimination capabilities of the demodulator in the contactless card. They can even go as far as causing a loss of clock on the contactless card or a loss of remote power feed.

It will be recalled that for remotely powered transponders, this is equivalent to a loss of the transmission channel, therefore requiring the latter to be reestablished, which considerably lengthens the communication time. At the extreme, the information can no longer be transmitted and there is a failure of communication between the transmitter and the transponder.

It should also be noted that the phase modulation spreads the transmission spectrum with very strong raising of the side lobes that can lead to situations that do not comply with recommendation ERC 70-03, a radio transmission standard.

FIG. 1 is a chronological diagram showing, by way of example, the succession of levels for two symbols n−1 and n of a length equal to $8*T_c$ ($T_c=1/f_c$, in which $f_c$ is the carrier frequency, for example 13.56 MHz), of which the phase difference between the two is $3\pi/4$. In the interests of simplicity, only one cycle of the symbol n−1 and five cycles of the symbol n are represented.

The top part referenced by the arrow 1 shows the transition according to the state of the art.

It will be observed that, on the transition from the symbol n−1 to the symbol n, the low level 3 is extended in order for the first rising edge 5 of the symbol n to be directly phase shifted by $-3\pi/4$ in relation to the edges of the preceding symbol.

It is therefore these significant phase jumps which pose the problem for the remote power feed, for the recovery of the clock and for compliance with the European recommendations ERC-70-03 and/or ETS 300-330.

SUMMARY

The present invention aims to propose an optimized phase modulation method that makes it possible to at least partially overcome the abovementioned drawbacks.

To this end, the present invention proposes a method for the phase modulation of a carrier signal from a transmitter to a contactless transponder, in which data are coded in the form of consecutive symbols each corresponding to a predefined number of carrier cycles, and having a symbol time greater than or equal to two cycles of the carrier signal, characterized in that, on the transmitter, a phase jump of a symbol in relation to a preceding symbol is spread over a first part of the symbol time, the establishing of the phase jump being completed in the first part of the symbol time and the periods of the cycles being constant during the second part of the symbol time.

This method can in addition exhibit, alone or in combination, the following characteristics:
- when the phase jump between two consecutive symbols to be transmitted is greater than a predefined threshold, a phase jump portion is applied in a first part of the symbol time to at least two carrier cycles of the symbol to be transmitted, the sum of the phase jump portions being equal to the phase jump between the two consecutive symbols,
- the phase jump threshold between two consecutive symbols is $\pi/4$,
- a phase jump portion is less than or equal to $\pi/4$,
- the phase jump portions are all of the same value,
- the phase jump portions are applied successively to the first carrier cycles of the symbol to be transmitted,
- the phase jump portions are applied to the rising edges of the symbol to be transmitted,
- the phase jump, continuously, the signal and its derivative are spread over the first part of the symbol time,
- the symbol time is equal to four or eight carrier cycles,
- the first part of the symbol time has a duration less than or equal to 75% of the symbol time,
- the maximum phase jump between two consecutive symbols is strictly less than $\pi$.

Another subject of the invention is a device for the phase modulation of a carrier signal from a transmitter to a contactless transponder, comprising means for coding data in the form of consecutive symbols each corresponding to a predefined number of carrier cycles, and having a symbol time greater than or equal to two cycles of the carrier signal, characterized in that said data coding means are configured so as to apply a phase jump between two consecutive symbols by spreading, on the transmitter, a phase jump of a symbol in relation to a preceding symbol over a first part of the symbol time, the establishing of the phase jump being completed in the first part of the symbol time and the periods of the cycles being constant during the second part of the symbol time.

This device can in addition exhibit, alone or in combination, the following characteristics:
- the data coding means are configured to apply a phase jump portion to at least two carrier cycles of the symbol to be transmitted, when the phase jump between two consecutive symbols to be transmitted is greater than a predefined threshold,
- the phase jump threshold between two consecutive symbols is $\pi/4$,
- a phase jump portion is less than or equal to $\pi/4$,
- the phase jump portions are all of the same value,
- said data coding means are configured so as to apply the phase jump portions successively to the first carrier cycles of the symbol to be transmitted,
- said data coding means are configured so as to apply the phase jump portions to the rising edges of the symbol to be transmitted,
- said data coding means comprise cells for applying a portion of a phase jump to a carrier signal, so as to cover the entire range of the phase states, a multiplexer receiving as input the carrier signals and the phase shifted carrier signals, as well as the data to be coded, and a multiplexing control unit controlling the multiplexer, said data coding means are configured so as to spread the phase jump, continuously, signal and its derivative, over the first part of the symbol time, said data coding means comprise a phase slip module which works by variation of the carrier frequency during the first part of the symbol time, the time of a symbol is equal to four or eight carrier cycles, the first part of the symbol time has a duration less than or equal to 75% of the symbol time, the maximum total phase jump between two consecutive symbols is strictly less than π.

BRIEF DESCRIPTION OF THE FIGURES

Other advantages and features will become apparent on reading the description of the invention, and the following figures in which.

DETAILED DESCRIPTION

In all the figures, the identical elements bear the same reference numbers.

Hereinbelow, the term "symbol" signifies an element of a data coding alphabet. A symbol can, for example, be a set of 3 bits, such as 011.

There now follows a description of a method for the phase modulation of a carrier signal from a transmitter to a contactless transponder, in which, to have a sufficient and high data rate, data are coded in the form of consecutive symbols having a predefined number of carrier cycles.

The phase modulation method comprises at least four phase states, notably four or eight phase states.

In the present case, the transmitter is a base station, for example a contactless card reader.

With regard to the contactless transponder, it may equally relate to remotely powered transponders and to transponders that have their own power source, for example a battery, but which also have to operate without, either for certain applications, or in case of failure of the energy source. The transponder may be incorporated in a support such as a tag or card.

Both the case of the phase modulation of a carrier signal with a fixed symbol time $T_s$ and the case of a variable symbol time $T_s$, defined, for example, by the number of cycles per symbol, are included.

The duration of a symbol, or the symbol time $T_s$ is greater than or equal to two carrier signal cycles, for example equal to three, four or eight carrier cycles (here, the carrier signal has a frequency $f_c$=13.56 MHz to simplify the compatibility with the existing situation, notably the ISO 14443 Standard.

The general idea of the present invention consists in limiting as far as possible the undesirable effect of the phase jumps between two symbols while allowing for a high data rate. This can be done by spreading a phase jump of one symbol in relation to a preceding symbol over a first part of the symbol time, the establishing of the phase jump being completed in the first part of the symbol time and the periods of the cycles being constant during the second part of the symbol time, in particular to allow for the demodulation and the decoding of the signal.

Figure 1:
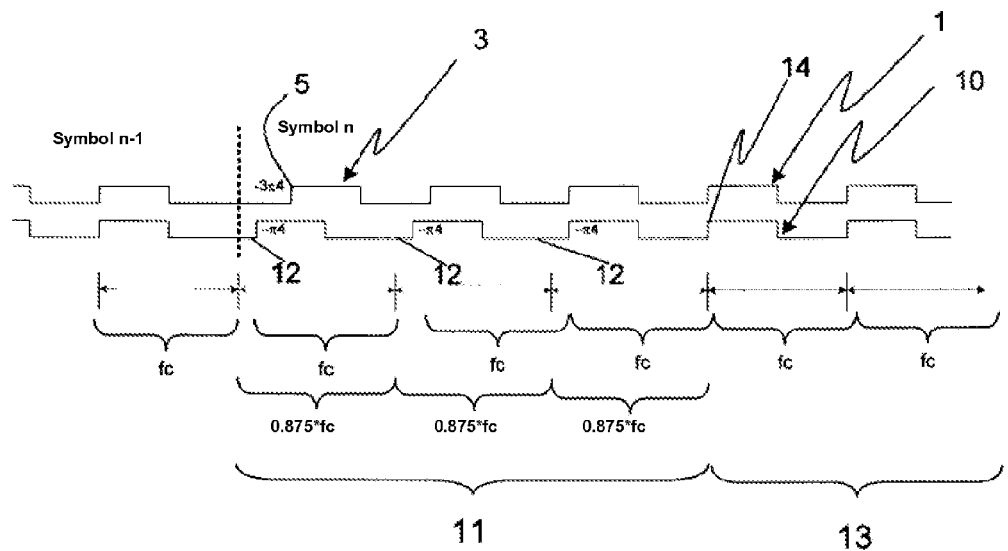
FIG. 1 is a chronological diagram showing, on the one hand, the transition between two symbols according to the prior art and, on the other hand, the transition between two symbols according to the method of the invention.

To return to FIG. 1, described previously for its part concerning the state of the art, interest is now focused on the bottom part referenced by the arrow 10 representing, by way of example, a transition according to the invention.

As can be seen in this figure, on the transition from the symbol n−1 to the symbol n, for the first part 11 of the symbol n, the first three low levels 12 of the symbol n are extended by −π/4 so that only the fourth rising edge 14 is phase shifted by −3π/4 in relation to the edges of the preceding symbol n−1. It follows therefrom that the "frequency" of this period of the symbol is reduced, here for example 0.875 $f_c$. It will therefore be noted that the establishing of the phase jump is completed in the first part 11 of the symbol type.

During the second part 13 of the symbol n, the total phase jump −3π/4 is then established, and allows for the demodulation and the decoding of the signal. It will be noted that the periods of the cycles are constant during the second part of the symbol time.

It will therefore be understood that, here, a significant phase jump of one symbol in relation to a preceding symbol is spread by phase jump portions over successive carrier cycles.

Figure 2:
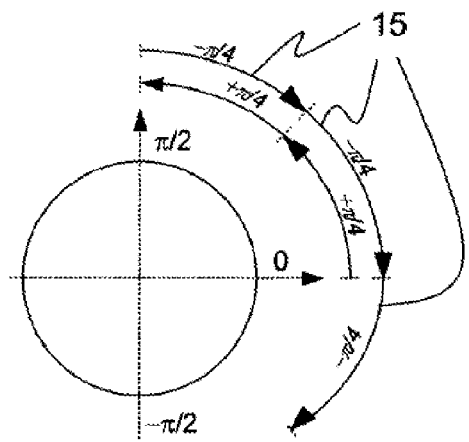
FIG. 2 is a phase state constellation diagram for a method according to the invention.

This is illustrated by way of example in the constellation diagram of FIG. 2 showing, on the one hand, four phase states π/2, π/4, 0, and −π/4 and, on the other hand, by arrows 15, rules for switching from one phase state to another.

Thus, if the phase jump is from ±π/4, the phase jump is applied directly to the first carrier cycle of the next symbol.

However, when the phase jump between two consecutive symbols is greater than a predefined threshold, for example greater than π/4, a phase jump portion, for example phase jumps of π/4, is applied in the first part 11 of the symbol to at least two carrier cycles of the symbol to be transmitted, the sum of the phase jump portions being equal to the phase jump between the two consecutive symbols.

In this diagram, it will be seen that switching from the phase state 0 to π/2 involves two successive jumps of +π/4.

And, switching from π/2 to −π/4 involves three successive jumps of −π/4 (3*(−π/4)=−3π/4).

It has proven advisable for the phase jump threshold between two consecutive symbols which triggers the act of switching by phase jump portions to be π/4.

Figure 3:
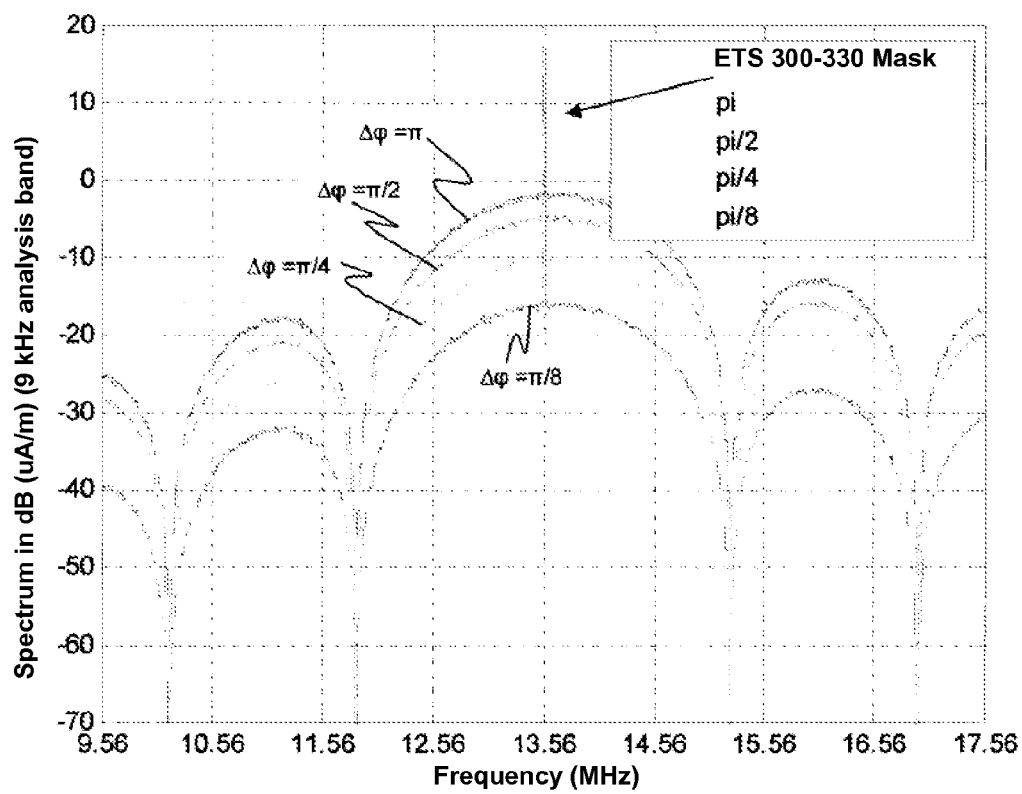
FIG. 3 shows the theoretical electromagnetic emission spectrum induced by phase jumps.

As can be seen in FIG. 3 showing the electromagnetic emission spectrum induced by phase jumps of π, π/2, π/4 and π/8 as well as the ETS recommendation 300-330 mask, by proceeding by phase jump portions less than or equal to π/4 (for example also π/8), the constraints stipulated by these recommendations are satisfied.

As has been shown above, the phase jump portions are all of the same value of ±π/4.

In order for the total phase jump between two symbols to be established as quickly as possible, the phase jump portions are applied successively to the first carrier cycles of the symbol to be transmitted.

It has proven advisable for the first part 11 of the symbol during which the phase jump portions can be applied, to have a duration less than or equal to 75% of the symbol time.

For example, if the symbol has a duration of $8*T_c$, the phase jump portions are applied on the first six cycles so that the total phase jump between two symbols is established during the last two cycles.

In the case where there are, for example, eight phase states $\pi/2$, $3\pi/8$, $\pi/4$, $\pi/8$, 0, $-\pi/8$, $-\pi/4$ and $-3\pi/8$, to switch from a state of $\pi/2$ to $-3\pi/8$, it is possible to apply to the first carrier cycle of the symbol a first phase jump portion of $-\pi/4$, then to the next five cycles phase jump portions of $-\pi/8$, the total phase jump being $-\pi/8$.

To make it possible to more easily comply with the European recommendations, it is preferable, in the modulation scheme, for the maximum total phase jump between two consecutive symbols to be strictly less than $\pi$.

Figure 4:
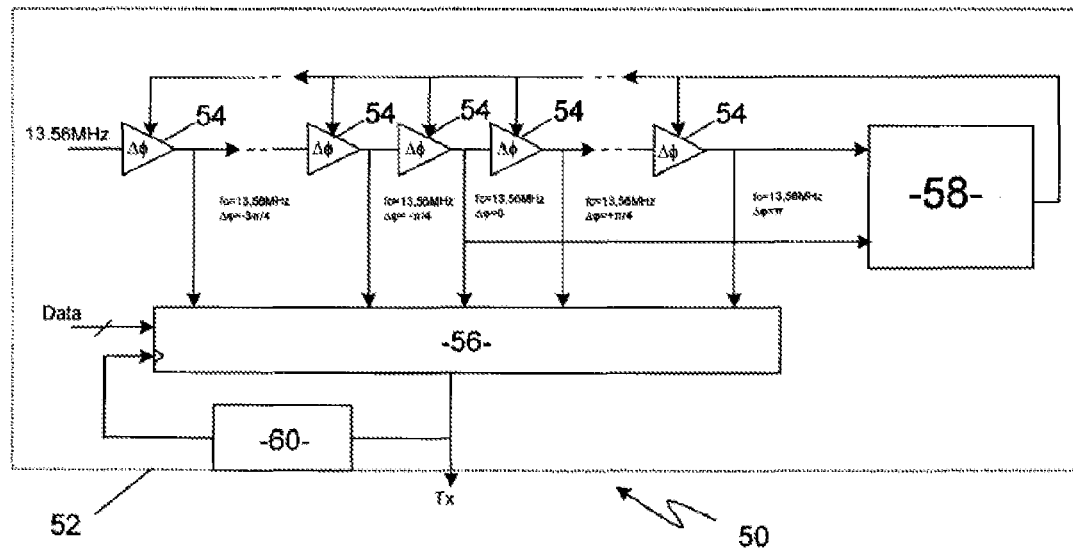
FIG. 4 shows a simplified diagram of a phase modulation device for the implementation of the method according to a first embodiment.

FIG. 4 shows a simplified diagram of a device 50 for phase modulation from a transmitter to a contactless transponder according to a first embodiment for the implementation of a method as described above.

This device 50 comprises means 52 for coding data in the form of consecutive symbols having a predefined number of carrier cycles, the duration of a symbol being greater than or equal to two carrier cycles.

These coding means 52 are configured so as to spread a phase jump between two consecutive symbols over a first part of the symbol, the establishing of the phase jump being completed in the first part of the symbol time and the periods of the cycles being constant during the second part of the symbol time.

To give more detail, these means 52 comprises phase shifting cells 54.

A carrier signal of frequency $f_c$=13.56 MHz is connected to an input of a first phase shifting cell 54 phase shifting the carrier by a value $\Delta\phi=T_c/n$ (in which n is the number of phase shifting cells). To obtain positive and negative phase shifts, the phase reference is, by convention, placed in the middle of the chain of phase shifters.

In the case where n=8, the first cell delivers a carrier in the phase state $-3\pi/4$. Each phase shifting cell is connected on the one hand to an input of a multiplexer 56 and on the other hand to an input of another phase shifting cell 54.

As can be seen in FIG. 4, there is thus a series of phase shifting cells 54 delivering, to associated inputs of the multiplexer 56, carriers corresponding to the various phase states in accordance with the selected constellation diagram, for example that of FIG. 2. The entire range of the phase state is thus covered.

A phase comparator 58 receives as input a reference carrier signal considered to be not phase shifted and a carrier signal phase shifted by $\pi$ and delivers its output signal to the control inputs of the phase shifting cells 54.

The multiplexer 56 also comprises a data input and a multiplexing control unit 60 receiving as input the transmission output of the multiplexer 56 and delivering a control signal to a corresponding input of this multiplexer 56. This control unit 60 selects the carrier input of the multiplexer 56 which is transmitted to the transmission output Tx.

Thus, when the phase jump between two consecutive symbols to be transmitted is greater than a predefined threshold, for example $\pi/4$, the control unit 60 progressively switches over from the carrier transmitted with the preceding symbol to the carrier to be reached, passing through intermediate phase states in a first portion 11 of the symbol.

The configuration of FIG. 4 shows an example where the phase jump portion is equal to $\pi/4$, but it is also possible to choose for it to be less than $\pi/4$, for example $\pi/8$.

The coding means 52 are configured so as to apply the phase jump portions successively to the first edges of the symbol to be transmitted.

Figure 5:
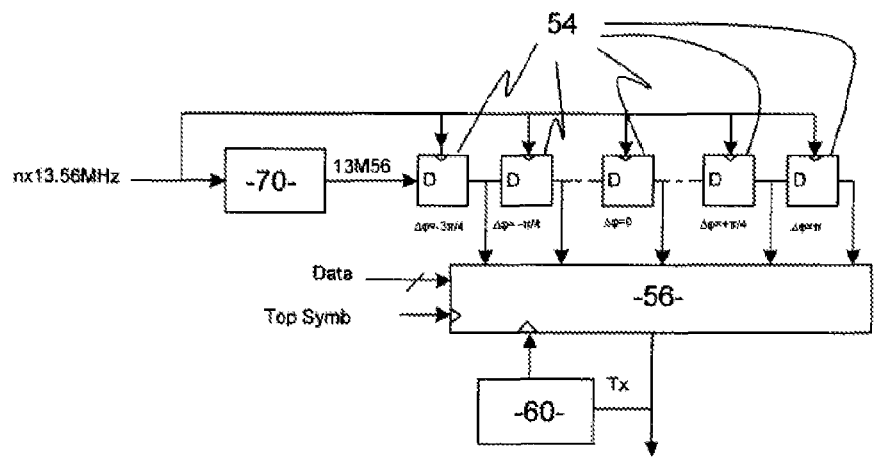
FIG. 5 shows a simplified diagram of a variant of the phase modulation device.

FIG. 5 shows a variant of the modulation device of FIG. 4.

This variant is differentiated from the device of FIG. 4 by the fact that the carrier is recreated from a signal of frequency $n*f_c$ (where n is the number of phase shifting cells) using a divider 70, then, as previously, the carrier is successively phase shifted logically by D flip-flops forming a phase shifting cell 54 of a value $\Delta\phi=T_c/n$.

According to another embodiment of the method according to the invention, called "analog mode", the phase jump is spread discretely by phase jump portions $\Delta\phi$ as described previously, but continuously, signal and its derivative, over the first part 11 of the symbol, the establishing of the phase jump being completed in the first part 11 of the symbol time and the periods of the cycles being constant during the second part 13 of the symbol time. This is referred to as phase slip.

Figure 6:
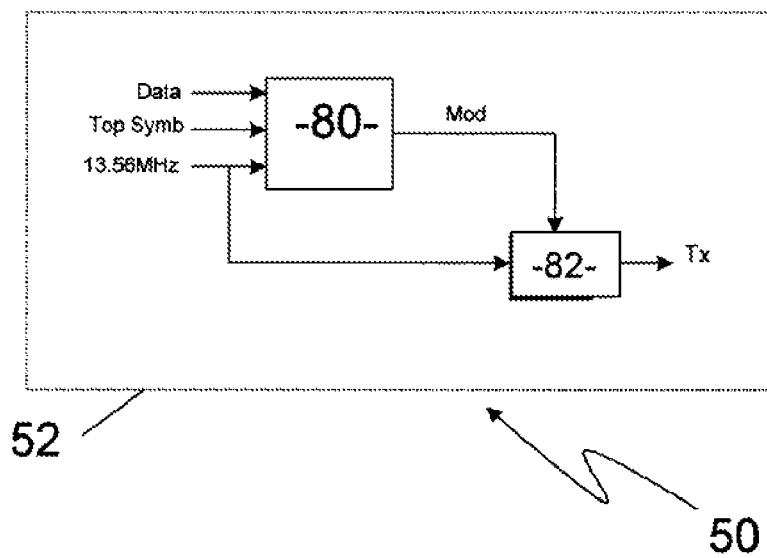
FIG. 6 shows a simplified diagram of a phase modulation device according to a second embodiment.

This embodiment can be implemented by a phase modulation device as represented in FIG. 6.

In this case, the data coding means 52 comprise a phase slip module 80 which works by variation of the carrier frequency during the first part of the symbol time.

This module 80 receives as input the data, a symbol start signal ("Top Symb") and a carrier signal, for example at 13.56 MHz.

This carrier signal as well as the output signal Mod of the module 80 are delivered at the inputs of a frequency modulator 82 which delivers at its output the signal Tx to be transmitted.

Figure 7:
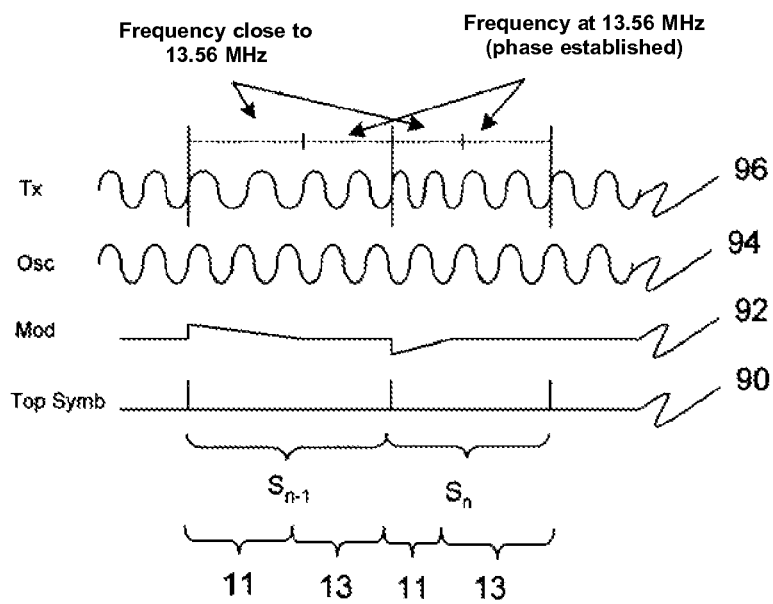
FIG. 7 is a chronological diagram explaining the operation of the device of FIG. 6.

FIG. 7 shows a chronological diagram of two consecutive symbols $S_{n-1}$ and $S_n$ making it possible to explain the operation of the device of FIG. 6.

The first line 90 shows the symbol start synchronization signals ("Top Symb"), the second line 92 shows the output signal of the module 80.

The third line 94 shows the carrier signal OSC at the input of the frequency modulator 82 and the fourth line 96 at the output Tx of the frequency modulator 82.

On the line Mod, for each of the two symbols $S_{n-1}$ and $S_n$, a first part 11 can be distinguished in the form of a ramp, rising or falling depending on the total phase jump to be achieved, a ramp representing the variation of the frequency of the carrier to reach the final phase state in the second part 13 of the symbol time.

It will therefore be understood that the invention makes it possible to maintain on the one hand the remote power feed and on the other hand the supply of the clock, while allowing for an optimized data rate.

The invention claimed is:

1. A method for phase modulation of a carrier signal from a transmitter to a contactless transponder in which data is coded as consecutive symbols, each corresponding to a predefined number of carrier cycles, and in which a symbol time is at least two carrier cycles of said carrier signal, said method comprising, at said transmitter, spreading a phase jump of a symbol in relation to a preceding symbol over a first part of said symbol time, establishment of said phase jump being completed in said first part of said symbol time and periods of said carrier cycles being constant during a second part of said symbol time when the phase jump between two consecutive symbols to be transmitted is greater than a predefined threshold, a phase jump portion is applied in a first part of the symbol time to at least two carrier cycles of the symbol to be transmitted, the sum of the phase jump portions being equal to the phase jump between the two consecutive symbols.

2. The method of claim 1, wherein said phase modulation comprises at least four phase states.

3. The method of claim 1, wherein said phase modulation comprises at least eight phase states.

4. The method of claim 1, wherein said predefined phase jump threshold is $\pi/4$.

5. The method of claim 1, wherein a phase jump portion is less than or equal to $\pi/4$.

6. The method of claim 1, wherein phase jump portions are all of the same value.

7. The method of claim 1, further comprising applying phase jump portions successively to first carrier cycles of a symbol to be transmitted.

8. The method of claim 1, further comprising applying said phase jump portions to rising edges of said symbol to be transmitted.

9. The method of claim 1, wherein said symbol time is equal to four or eight carrier cycles.

10. The method of claim 1, wherein said first part of said symbol time has a duration that is less than or equal to 75% of said symbol time.

11. The method of claim 1, wherein a maximum phase jump between two consecutive symbols is less than $\pi$.

12. An apparatus for phase modulation of a carrier signal from a transmitter to a contactless transponder, said apparatus comprising a data coder for coding data as consecutive symbols, each corresponding to a predefined number of carrier cycles and having a symbol time that is at least two carrier cycles of said carrier signal, wherein said data coder is configured to apply a phase jump between two consecutive symbols by spreading, on said transmitter, a phase jump of a symbol in relation to a preceding symbol over a first part of said symbol time, establishment of said phase jump being completed in said first part of said symbol time and periods of said carrier cycles being constant during a second part of said symbol time, the data coder being configured to apply a phase jump portion to at least two carrier cycles of the symbol to be transmitted, when the phase jump between two consecutive symbols to be transmitted is greater than a predefined threshold, the sum of the phase jump portions being equal to the phase jump between the two consecutive symbols.

13. The apparatus of claim 12, wherein said phase modulation comprises at least four phase states.

14. The apparatus of claim 12, wherein said predefined phase jump threshold is $\pi/4$.

15. The apparatus of claim 12, wherein said phase jump portion is less than or equal to $\pi/4$.

16. The apparatus of claim 12 wherein phase jump portions are all of the same value.

17. The apparatus of claim 12, wherein said data coder is configured to apply phase jump portions successively to first carrier cycles of a symbol to be transmitted.

18. The apparatus of claim 12, wherein said data coder is configured to apply phase jump portions to rising edges of a symbol to be transmitted.

19. The apparatus of claim 12, wherein said data coder further comprises cells for applying a phase jump portion to a carrier signal to cover a range of phase states, a multiplexer for receiving, as input, said carrier signals, said phase-shifted carrier signals, and data to be coded, and a multiplexing control unit for controlling said multiplexer.

20. The apparatus of claim 12, wherein said symbol time is equal to four or eight carrier cycles.

21. The apparatus of claim 12, wherein said first part of said symbol time has a duration less than or equal to 75% of said symbol time.

22. The apparatus of claim 12, wherein a maximum total phase jump between two consecutive symbols is less than $\pi$.

* * * * *